United States Patent
Hong et al.

(10) Patent No.: US 12,211,760 B2
(45) Date of Patent: Jan. 28, 2025

(54) INTEGRATED CIRCUIT DEVICES INCLUDING A PARAMETER MEASURING STRUCTURE AND METHODS OF FORMING THE SAME

(71) Applicant: Samsung Electronics Co., Ltd., Suwon-si (KR)

(72) Inventors: Byounghak Hong, Albany, NY (US); Wookhyun Kwon, Hwaseong-si (KR); Hyoeun Park, Cohoes, NY (US); Kangill Seo, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 417 days.

(21) Appl. No.: 17/837,453

(22) Filed: Jun. 10, 2022

(65) Prior Publication Data
US 2023/0326813 A1   Oct. 12, 2023

Related U.S. Application Data

(60) Provisional application No. 63/328,814, filed on Apr. 8, 2022.

(51) Int. Cl.
*H01L 21/66* (2006.01)
(52) U.S. Cl.
CPC .................... *H01L 22/34* (2013.01)
(58) Field of Classification Search
CPC ...................................................... H01L 22/34
See application file for complete search history.

(56) References Cited

U.S. PATENT DOCUMENTS

| | | | |
|---|---|---|---|
| 6,878,964 | B1 | 4/2005 | Lien et al. |
| 7,954,080 | B2 | 5/2011 | Yen et al. |
| 8,350,586 | B2 | 1/2013 | Cho et al. |
| 8,436,626 | B2 | 5/2013 | Cho |
| 8,598,579 | B2 | 12/2013 | Chumakov et al. |
| 8,809,073 | B2 | 8/2014 | Yen et al. |
| 8,922,230 | B2 | 12/2014 | Wang et al. |
| 9,530,705 | B2 | 12/2016 | Yen et al. |
| 9,568,543 | B2 | 2/2017 | Wang et al. |
| 9,841,458 | B2 | 12/2017 | Cho |
| 10,622,257 | B2 | 4/2020 | Zhang et al. |
| 11,164,770 | B1 | 11/2021 | Or-Bach et al. |
| 2020/0020601 | A1* | 1/2020 | Lin .................. H10B 41/35 |
| 2022/0115270 | A1* | 4/2022 | Yoshida ............. H01L 29/6653 |

FOREIGN PATENT DOCUMENTS

CN            111679171 A        9/2020

* cited by examiner

*Primary Examiner* — Evren Seven
(74) *Attorney, Agent, or Firm* — Myers Bigel, P.A.

(57) ABSTRACT

Integrated circuit devices may include a cell transistor and a parameter measuring structure (e.g., a resistance measuring structure). The cell transistor may be on a first surface of a substrate structure, which is opposite a second surface thereof. The parameter measuring structure may include first and second contact structures that extend through the substrate structure. The second surface of the substrate structure may expose respective portions of the first and second contact structures.

20 Claims, 15 Drawing Sheets

INTEGRATED CIRCUIT DEVICES INCLUDING A PARAMETER MEASURING STRUCTURE AND METHODS OF FORMING THE SAME

CROSS-REFERENCE TO RELATED APPLICATION

This application claims priority to U.S. Provisional Application Ser. No. 63/328,814, entitled RESISTANCE MEASURING STRUCTURES OF INTEGRATED CIRCUIT DEVICES, filed in the USPTO on Apr. 8, 2022, the disclosure of which is hereby incorporated by reference herein in its entirety.

FIELD

The present disclosure generally relates to the field of electronics and, more particularly, to integrated circuit devices including a parameter measuring structure.

BACKGROUND

Various structures of integrated circuit devices and methods of forming the same have been proposed to increase the integration density thereof. Performance of integrated circuit devices may depend on resistances of conductive elements (e.g., conductive elements formed through the middle-of-line (MOL) portion of device fabrication steps), and thus measuring those resistances may be beneficial to evaluate or improve performance of the integrated circuit devices.

SUMMARY

According to some embodiments of the present invention, resistance measuring structures may include a first transistor and a second transistor on a substrate structure. The first transistor may include a first source/drain region and a first gate electrode, and the second transistor may include a second source/drain region and a second gate electrode that is electrically connected to the first gate electrode. The resistance measuring structures may also include a source/drain connection on the first and second source/drain regions and a contact structure extending between the first and second source/drain regions and extending through the substrate structure. The first source/drain region may be electrically connected to the second source/drain region through the source/drain connection.

According to some embodiments of the present invention, resistance measuring structures may include a first transistor and a second transistor on a substrate structure. The first transistor may include a first source/drain region, and the second transistor may include a second source/drain region that is electrically connected to the first source/drain region, and the first transistor may further include a third source/drain region. The resistance measuring structures may also include a first conductive pad and a second conductive pad in the substrate structure. The first conductive pad may be electrically connected to the first and second source/drain regions, and the second conductive pad may be electrically connected to the third source/drain region. The substrate structure may include a first surface facing the first and second source/drain regions and a second surface opposite the first surface, and the second surface of the substrate structure may expose respective portions of the first and second conductive pads.

According to some embodiments of the present invention, integrated circuit devices may include a cell transistor that is on a substrate structure and including a cell gate electrode, an insulating layer on the substrate structure, the cell gate electrode being in the insulating layer, and a parameter measuring structure comprising first and second contact structures that extend through the substrate structure and the insulating layer. The substrate structure may include a first surface facing the insulating layer and a second surface opposite the first surface, and the second surface of the substrate structure may expose respective portions of the first and second contact structures.

DETAILED DESCRIPTION

According to some presented embodiments, an integrated circuit device may include a first region including cell transistors and a second region including a parameter measuring structure (e.g., a resistance measuring structure or a scattering parameter (s-parameter) measuring structure). The parameter measuring structure may include conductive pads that are exposed by a back side of a substrate structure. Those conductive pads may be electrically connected to elements (e.g., a source/drain region or a gate electrode) formed on a front side of the substrate structure through contact structures extending through the substrate structure.

Figure 1:
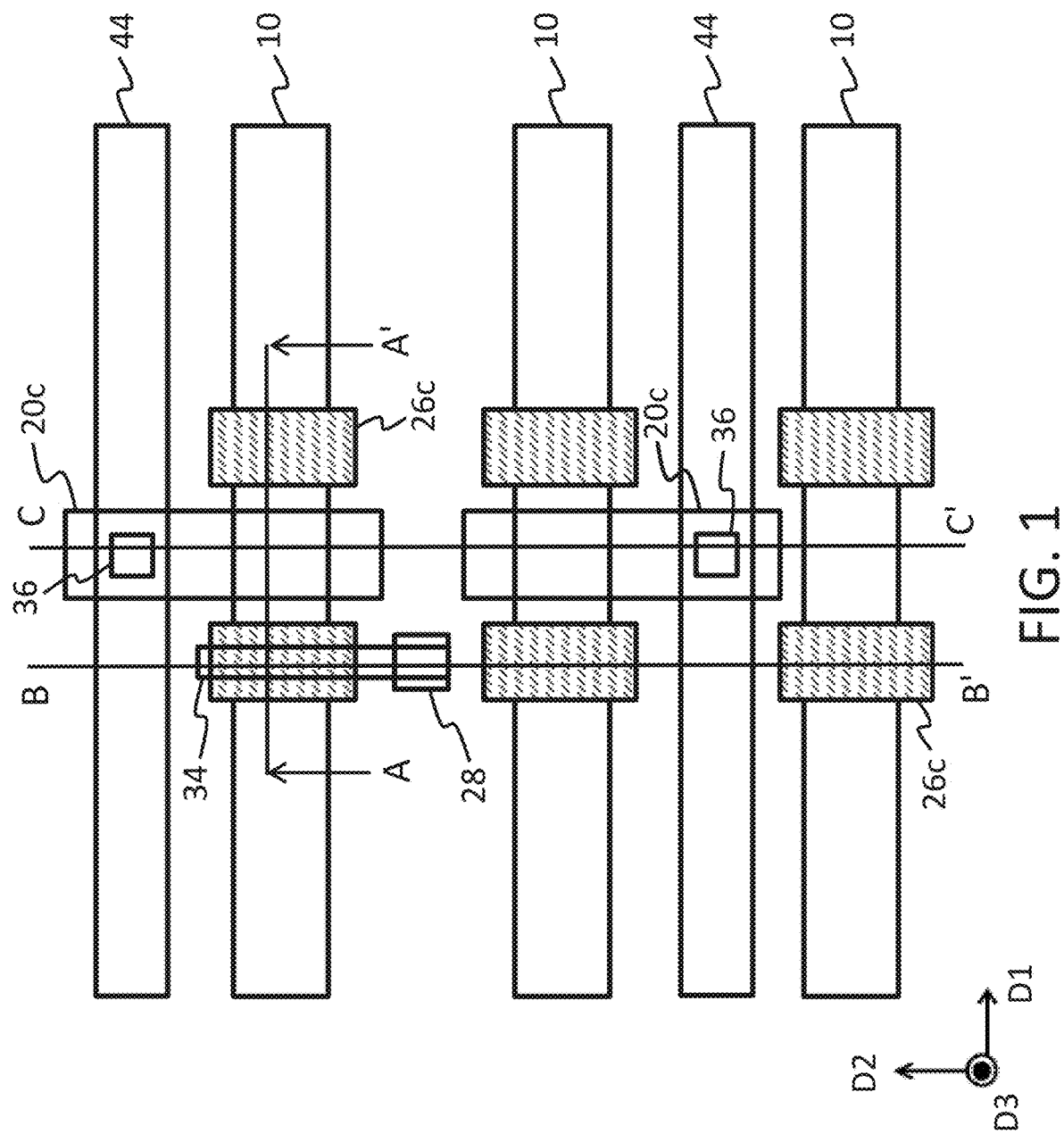
FIG. 1 is a layout of the first region including cell transistors according to some embodiments of the present invention.
Figure 2:
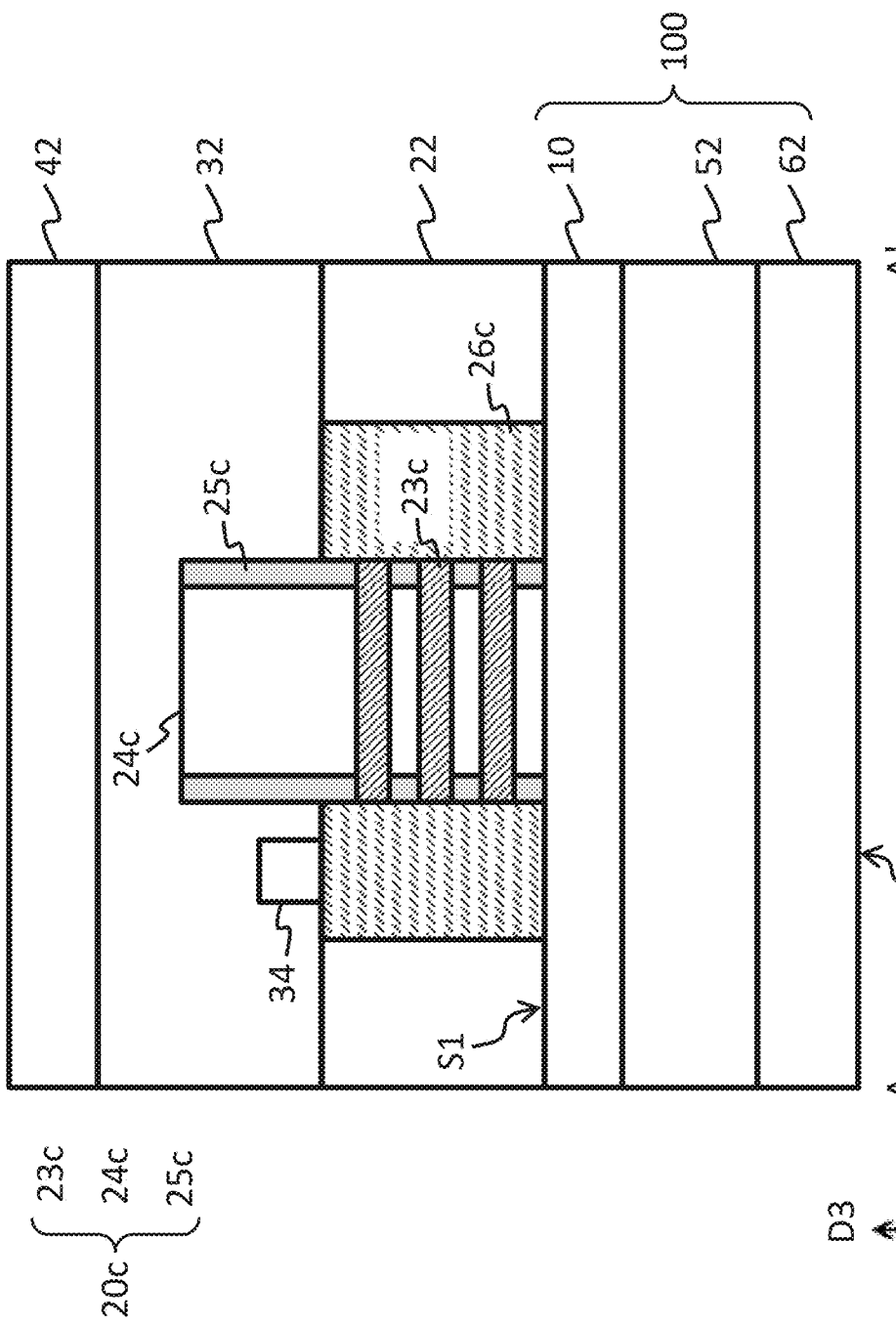
FIGS. 2, 3 and 4 illustrate cross-sectional views of the first region taken along the lines A-A', B-B' and C-C' in FIG. 1, respectively, according to some embodiments of the present invention.
Figure 3:
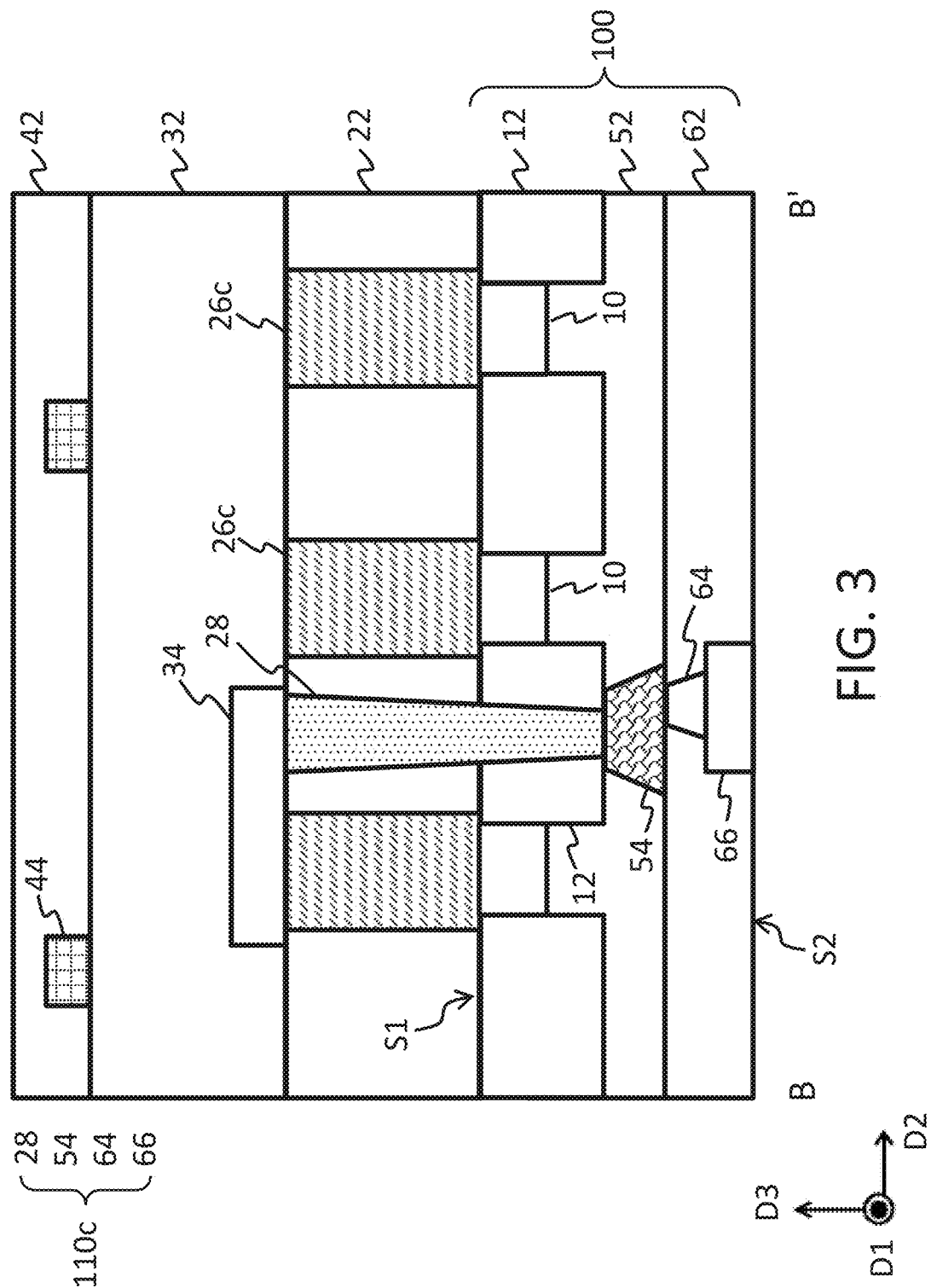
Figure 4:
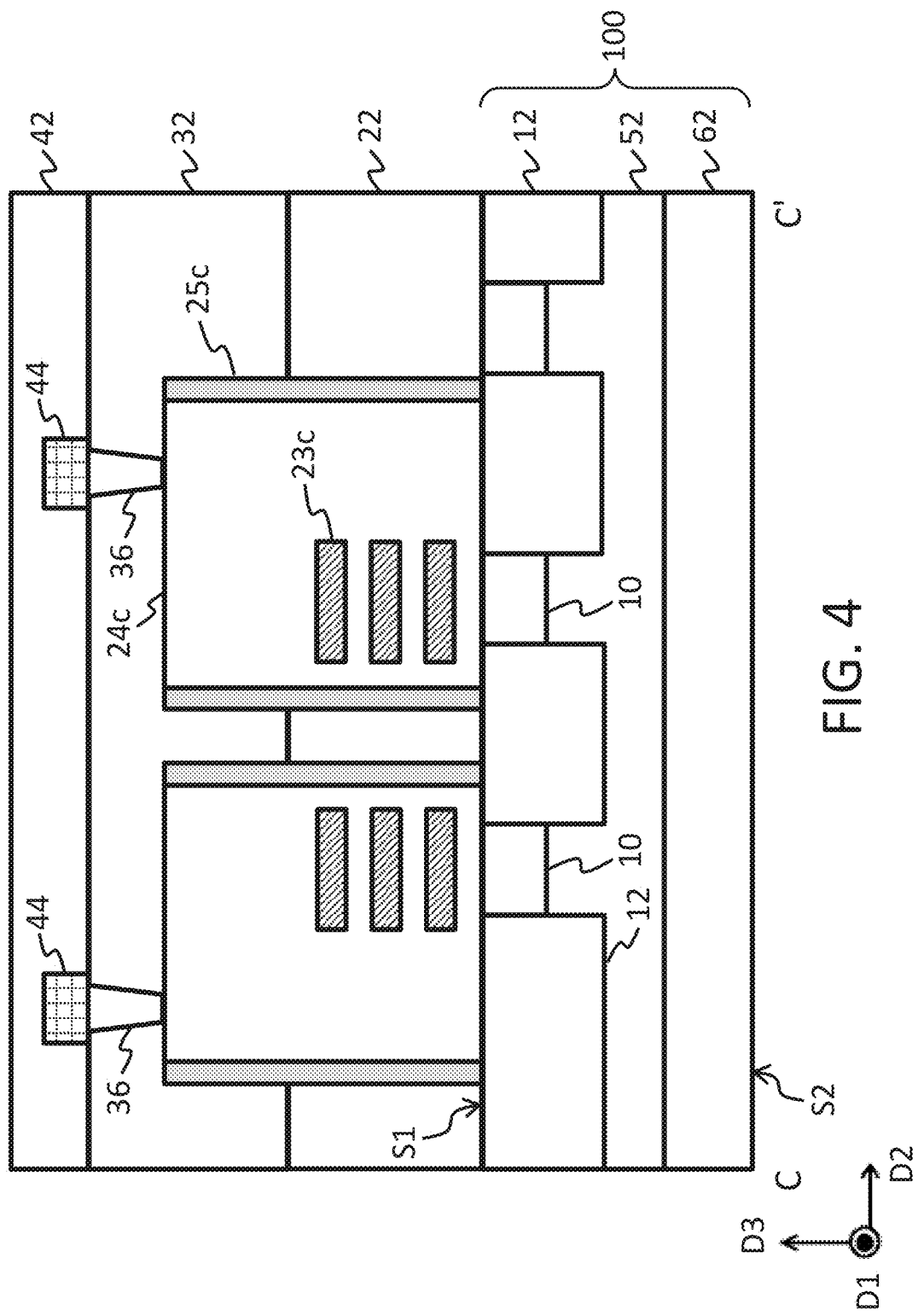

FIG. 1 is a layout of the first region including cell transistors according to some example embodiments, FIGS. 2, 3 and 4 illustrate cross-sectional views of the first region taken along the lines A-A', B-B' and C-C' in FIG. 1, respectively, according to some embodiments.

In some embodiments, the cell transistors may be transistors of a standard cell (SC) or transistors of a memory device. The standard cells may be, for example, an inverter, a 2-input NAND gate, a 3-input NAND gate, a 2-input NOR gate, a 3-input NOR gate, an And-Or inverter (AOI), an Or-And inverter (OAI), an XNOR gate, an XOR gate, a multiplexer (MUX), a latch, or a D-flip-flop.

Referring to FIGS. 1 through 4, the first region of the integrated circuit device may include cell transistors provided on a substrate structure 100. Each of the cell transistors may include a cell gate structure 20c and cell source/drain regions 26c that are adjacent opposing side surfaces of the cell gate structure 20c, respectively, and are spaced apart from each other in a first horizontal direction (e.g., a first direction D1). Each of the cell gate structures 20c may extend longitudinally in a second horizontal direction (e.g., a second direction D2) as illustrated in FIG. 1. The cell gate structure 20c may include a cell channel region 23c connected to the cell source/drain regions 26c, a cell gate electrode 24c and a cell gate spacer 25c that separates the cell gate electrode 24c from the cell source/drain regions 26c to electrically isolate the cell gate electrode 24c from the cell source/drain regions 26c. The cell channel region 23c may be a nanosheet or a nanowire having a thickness in a range of, for example, from 1 nm to 100 nm in a vertical direction (e.g., a third direction D3). The cell channel region 23c may include semiconductor material(s) (e.g., silicon, germanium, silicon-germanium, and/or a group III-V semiconductor compound). The third direction D3 may be perpendicular to the first and second directions D1 and D2.

Although FIGS. 2 and 4 illustrate that each of the cell gate structures 20c includes three channel regions 23c stacked in the vertical direction, the present invention is not limited thereto. In some embodiments, each of the cell gate structure 20c may include a single channel region 23c. Further, although FIGS. 2 and 4 illustrate each of the cell transistors as a gate-all-around field-effect transistor (GAA FET), each of the cell transistors may be implemented using various types of transistors (e.g., a fin field-effect transistor (FinFET), a recessed channel array transistor (RCAT) or a planar transistor).

Still further, although FIGS. 1 and 2 illustrate that each of the cell transistors includes source/drain regions spaced apart from each other in the first horizontal direction, the present invention is not limited thereto. For example, in other embodiments, each of the cell transistors may be a vertical field effect transistor (VFET) including cell source/drain regions spaced apart from each other in the vertical direction, and one of the cell source/drain regions may be provided in the substrate structure 100.

The cell source/drain regions 26c may include a semiconductor material (e.g., Si or SiGe) and may further include impurities (e.g., B, P or As). Although the cell gate electrode 24c is illustrated as a single layer, the cell gate electrode 24c may include multiple layers. For example, the cell gate electrode 24c may include a semiconductor layer (e.g., a poly silicon layer), a work function layer (e.g., TiC layer, TiAl layer, TiAlC layer or TiN layer) and/or a metal layer (e.g., a tungsten layer, an aluminum layer or a copper layer). Further, although not illustrated in FIGS. 2 and 4, a gate insulator and/or an interfacial layer are provided between the cell channel region 23c and the cell gate electrode 24c.

For example, the cell gate spacer 25c may include an insulating material (e.g., silicon oxide, silicon nitride, silicon oxynitride, silicon carbide or low-k material). The low k material may include, for example, fluorine-doped silicon dioxide, organosilicate glass, carbon-doped oxide, porous silicon dioxide porous organosilicate glass, a spin-on organic polymeric dielectric, or a spin-on silicon based polymeric dielectric.

A first insulating layer 22 may be provided on the substrate structure 100, and the cell source/drain regions 26c may be provided in the first insulating layer 22. The cell gate structure 20c and the first insulating layer 22 may be formed by the front-end-of-line (FEOL) portion of device fabrication steps.

A second insulating layer 32 may be provided on the first insulating layer 22, and a source/drain contact 34 and cell gate contacts 36 may be provided in the second insulating layer 32. The second insulating layer 32, the source/drain contact 34 and the cell gate contacts 36 may be formed by the middle-of-line (MOL) portion of device fabrication steps. Each of the cell source/drain regions 26c may include a lower surface facing the substrate structure 100 and an upper surface opposite the lower surface thereof. The source/drain contact 34 may contact the upper surface of one of the cell source/drain regions 26c. Each of the cell gate electrodes 24c may include a lower surface facing the substrate structure 100 and an upper surface opposite the lower surface thereof. The cell gate contacts 36 may contact the upper surfaces of the cell gate electrodes 24c, respectively.

A third insulating layer 42 may be provided on the second insulating layer 32, and cell gate wires 44 (e.g., metal wires) may be provided in the third insulating layer 42. The cell gate wires 44 and the third insulating layer 42 may be formed by the back-end-of-line (BEOL) portion of device fabrication steps. The cell gate wires 44 may contact upper surfaces of the cell gate contacts 36, respectively, as illustrated in FIG. 4.

The substrate structure 100 may include a first surface S1 facing the cell source/drain regions 26c and a second surface S2 that is opposite the first surface S1. The first surface S1 and the second surface S2 of the substrate structure 100 may be parallel to each other. The first direction D1 and the second direction D2 may be parallel to the first surface S1 and/or the second surface S2 of the substrate structure 100.

The substrate structure 100 may include a semiconductor substrate 10 that includes isolation regions 12. The substrate structure 100 may also include a fourth insulating layer 52 and a fifth insulating layer 62. The fourth insulating layer 52 may extend between the semiconductor substrate 10 and the fifth insulating layer 62.

The semiconductor substrate 10 may include one or more semiconductor materials, for example, Si, Ge, SiGe, GaP, GaAs, SiC, SiGeC and/or InP. For example, the substrate 10 may be a silicon layer that may be a portion of a silicon wafer.

A cell contact plug 28 may be provided in the first insulating layer 22 and one of the isolation regions 12. In some embodiments, the cell contact plug 28 may extend through the first insulating layer 22 and one of the isolation regions 12 as illustrated in FIG. 3.

A cell power rail 54 may be provided in the fourth insulating layer 52. In some embodiments, the cell contact plug 28 may contact the source/drain contact 34 (e.g., a lower surface of the source/drain contact 34) and the cell power rail 54 (e.g., an upper surface of the cell power rail 54) as illustrated in FIG. 3. In some embodiments, the fourth insulating layer 52 and the cell power rail 54 may be formed after the BEOL portion of device fabrication steps. Therefore, metal elements of the cell power rail 54 may not contaminate the cell transistors, and the cell power rail 54 may not go through high temperature processes of the FEOL portion of device fabrication steps.

The semiconductor substrate 10 may include a front side facing the cell source/drain regions 26c and a back side opposite the front side. In some embodiments, the fourth insulating layer 52 and the cell power rail 54 may be provided on the back side of the semiconductor substrate 10 as illustrated in FIG. 3, and thus the cell power rail 54 may be referred to as a back side power rail. The fourth insulating layer 52 and the cell power rail 54 may be formed by processes performed on the back side of the semiconductor substrate 10.

A cell power via 64 and a cell power wire 66 may be provided in the fifth insulating layer 62. The fifth insulating layer 62, the power via 64 and the cell power wire 66 may be elements of a power delivery network (PDN) structure. In some embodiments, the cell power rail 54 may contact the cell contact plug 28 (e.g., a lower surface of the cell contact plug 28) and the cell power via 64 (e.g., an upper surface of the cell power via 64). Although FIG. 3 illustrates one cell power via 64 and one cell power wire 66, the integrated circuit device may include multiple cell power vias 64 and multiple cell power wires 66.

The cell contact plug 28, the cell power rail 54, the cell power via 64 and the cell power wire 66 collectively may be a cell contact structure 110c. The cell contact structure 110c may extend through the first insulating layer 22 and the substrate structure 100. In some embodiments, the second surface S2 of the substrate structure 100 may expose a portion of the cell contact structure 110c (e.g., a portion of the cell power wire 66) as illustrated in FIG. 3. The exposed portion of the cell contact structure 110c may be a power pad. The exposed portion of the cell contact structure 110c may be electrically connected to a power source (e.g., a power source having a positive volage, zero voltage or ground voltage), and the cell source/drain region 26c may be electrically connected to the power source through the source/drain contact 34 and the cell contact structure 110c. In some embodiments, the substrate structure 100 may not cover at least a portion of the cell contact structure 110c (e.g., at least a portion of the cell power wire 66) as illustrated in FIG. 3.

Each of the first, second, third, fourth and fifth insulating layers 22, 32, 42, 52 and 62 may include, for example, silicon oxide, silicon nitride, silicon carbide and/or low-k material. Each of the cell contact plug 28, the source/drain contact 34, the cell gate contacts 36, the cell gate wires 44, the cell power rail 54, the cell power via 64 and the cell power wire 66 may include, for example, W, Al, Cu, Ru and/or Co. The low k material may include, for example, fluorine-doped silicon dioxide, organosilicate glass, carbon-doped oxide, porous silicon dioxide, porous organosilicate glass, a spin-on organic polymeric dielectric, or a spin-on silicon based polymeric dielectric.

Figure 5:
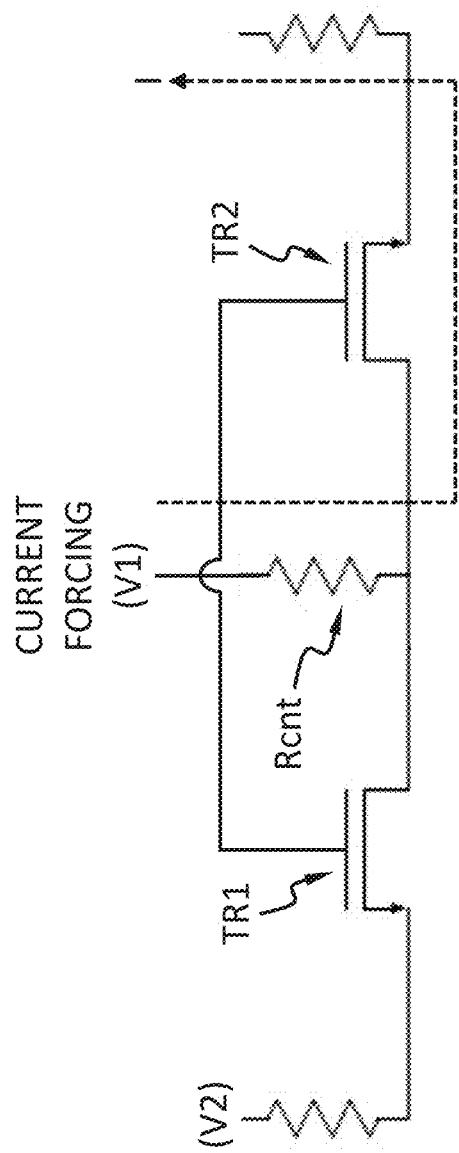
FIG. 5 is a circuit diagram of a resistance measuring structure of the second region of the integrated circuit device according to some embodiments of the present invention.
Figure 6:
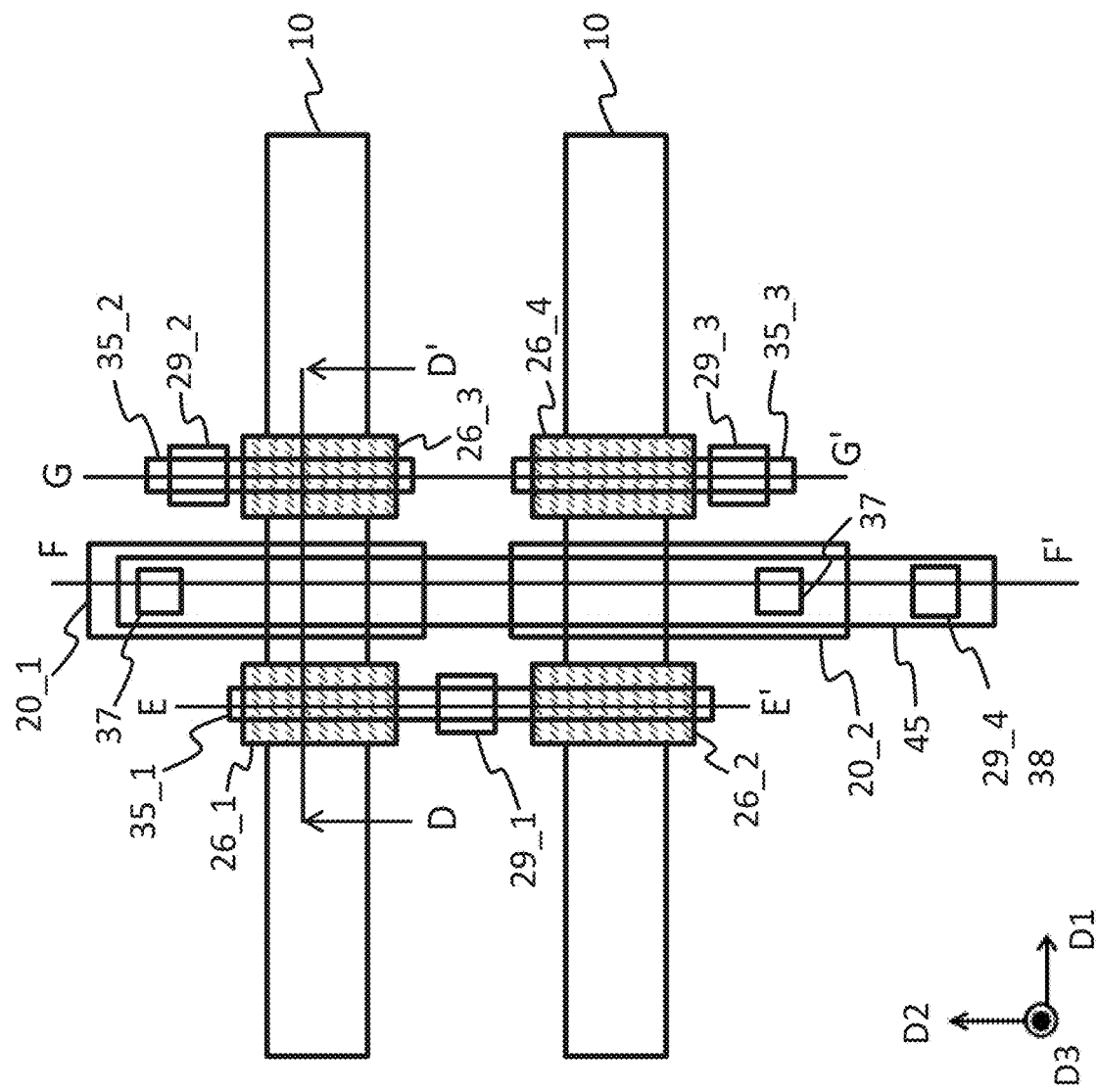
FIG. 6 is a layout of the resistance measuring structure in FIG. 5 according to some embodiments of the present invention.
Figure 7:
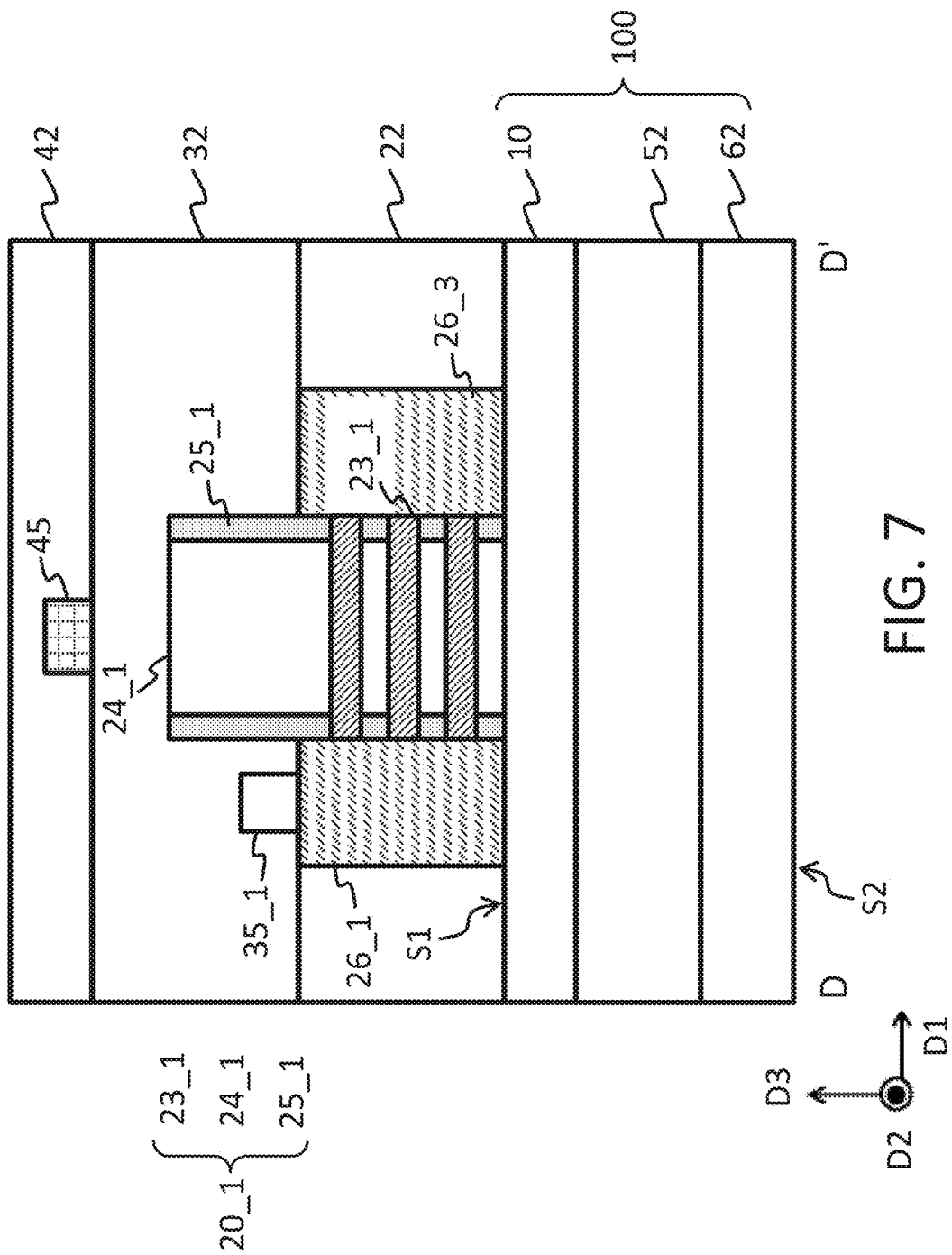
FIGS. 7, 8, 9 and 10 illustrate cross-sectional views taken along the lines D-D', E-E', F-F' and G-G' in FIG. 6, respectively, according to some embodiments of the present invention.

FIG. 5 is a circuit diagram of a resistance measuring structure of the second region of the integrated circuit device according to some embodiments. The resistance measuring structure may be used to measure resistance Rcnt of a first contact structure (e.g., a first contact structure 110_1 in FIG. 8), which is the same as resistance of the cell contact structure 110c. FIG. 6 is a layout of the resistance measuring structure in FIG. 5 according to some embodiments, and FIGS. 7, 8, 9 and 10 illustrate cross-sectional views taken along the lines D-D', E-E', F-F' and G-G' in FIG. 6, respectively, according to some embodiments.

Referring to FIG. 5, the resistance measuring structure may include a first transistor TR1 and a second transistor TR2. A first one of source/drain regions (e.g., a first source/drain region 26_1 in FIG. 8) of the first transistor TR1 and a first one of source/drain regions (e.g., a second source/drain region 26_2 in FIG. 8) of the second transistor TR2 may be electrically connected to each other, and gate electrodes (e.g., first and second gate electrodes 24_1 and 24_2 in FIG. 9) of the first and second transistors TR1 and TR2 may be electrically connected to each other. To obtain resistance Rcnt of the first contact structure 110_1, the first and second transistors TR1 and TR2 may be turned on by applying an appropriate gate voltage thereto, the first one of the source/drain regions of the first transistor TR1 and the first one of the source/drain regions of the second transistor TR2 may be electrically connected to a current source for current forcing and may be also electrically connected to a first probe of a voltage meter, a second one of the source/drain regions (e.g., a third source/drain region 26_3 in FIG. 10) of the first transistor TR1 may be electrically connected to a second probe of the voltage meter, and a second one of the source/drain regions (e.g., a fourth source/drain region 26_4 in FIG. 10) of the second transistor TR2 may be electrically connected to a current sensing circuit to measure a current I. The resistance Rcnt of the first contact structure 110_1 can be calculated by Equation 1.

$$Rcnt=(V1-V2)/I \qquad \text{Equation 1:}$$

V1-V2 is a voltage measured by the voltage meter.

Referring to FIGS. 7, 8, 9 and 10, the first transistor TR1 may include a first gate structure 20_1 and the first and third source/drain regions 26_1 and 26_3 adjacent opposing side surfaces of the first gate structure 20_1, respectively. The first gate structure 20_1 may include a first channel region 23_1, a first gate electrode 24_1 and a first gate spacer 25_1. The second transistor TR2 may include a second gate structure 20_2 and the second and fourth source/drain regions 26_2 and 26_4 adjacent opposing side surfaces of the second gate structure 20_2, respectively. The second gate structure 20_2 may include a second channel region 23_2, a second gate electrode 24_2 and a second gate spacer 25_2.

Figure 8:
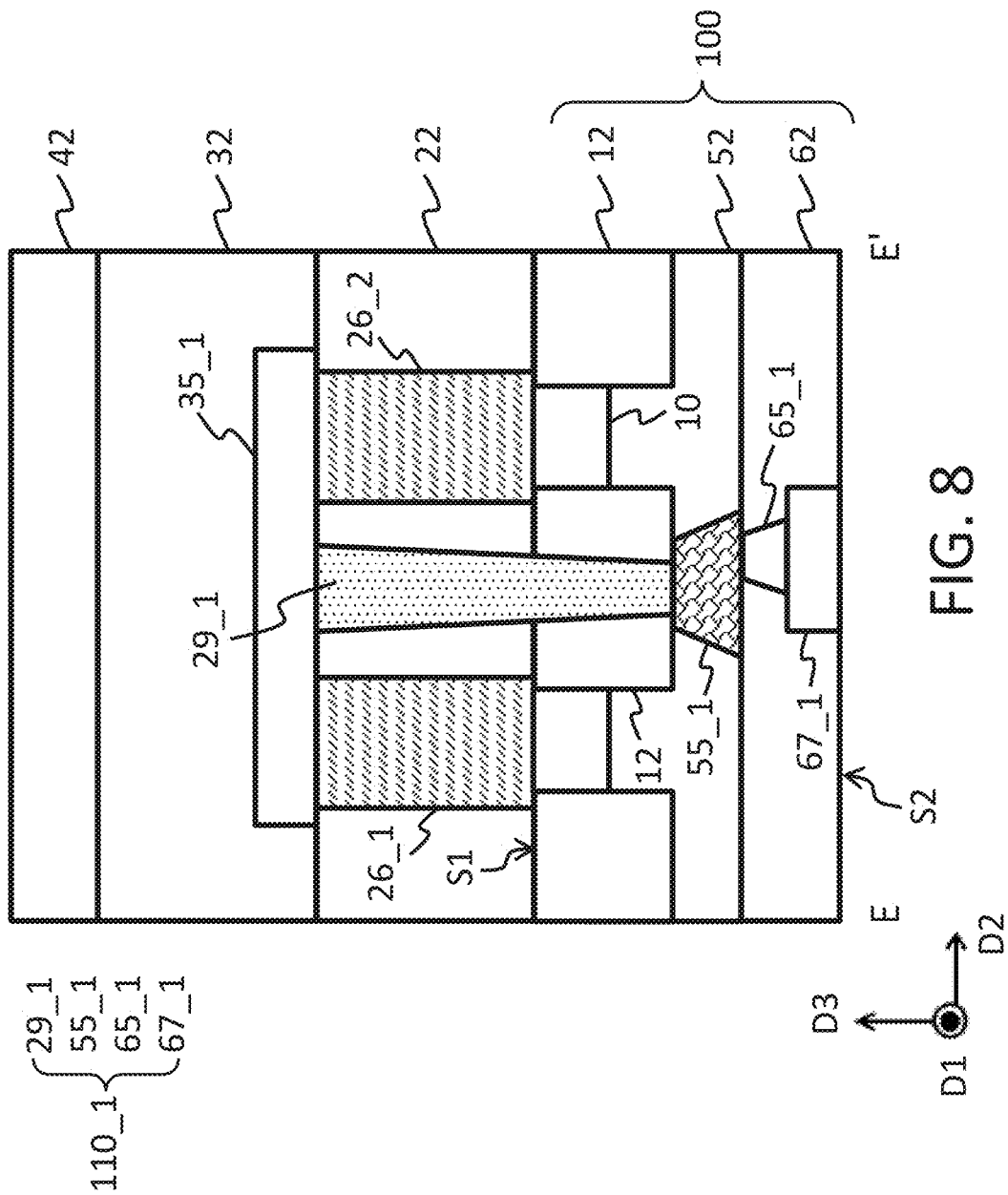

The resistance measuring structure may also include a first source/drain connection 35_1. In some embodiments, the first source/drain connection 35_1 may contact an upper surface of the first insulating layer 22. The first source/drain region 26_1 may be electrically connected to the second source/drain region 26_2 through the first source/drain connection 35_1. In some embodiments, the first source/drain connection 35_1 may overlap the first and second source/drain regions 26_1 and 26_2 in the vertical direction and may contact upper surfaces of the first and second source/drain regions 26_1 and 26_2 as illustrated in FIG. 8. Further, in some embodiments, the first source/drain connection 35_1 may extend between the first and second source/drain regions 26_1 and 26_2 as illustrated in FIG. 8.

The first source/drain connection 35_1 may be electrically connected to a first contact structure 110_1 that may include a first contact plug 29_1, a first power rail 55_1, a first power via 65_1 and a first power wire 67_1. In some embodiments, the first source/drain connection 35_1 may contact the first contact plug 29_1 (e.g., an upper surface of the first contact plug 29_1) as illustrated in FIG. 8. The first contact structure 110_1 may extend through the first insulating layer 22 and the substrate structure 100. The second surface S2 of the substrate structure 100 may expose a portion of the first contact structure 110_1 (e.g., a portion of the first power wire 67_1). The exposed portion of the first contact structure 110_1 may be a first conductive pad that may be electrically connected to a current source and may be also electrically connected to a first probe of a voltage meter. In some embodiments, the substrate structure 100 may not cover at least a portion of the first contact structure 110_1 (e.g., at least a portion of the first power wire 67_1) as illustrated in FIG. 8.

Further, the resistance measuring structure may include a second source/drain connection 35_2 electrically connected to the third source/drain region 26_3 and a third source/drain connection 35_3 electrically connected to the fourth source/drain region 26_4. In some embodiments, the second source/drain connection 35_2 may contact an upper surface of the third source/drain region 26_3 and the upper surface of the first insulating layer 22, and the third source/drain connection 35_3 may contact an upper surface of the fourth source/drain region 26_4 and the upper surface of the first insulating layer 22.

Figure 10:
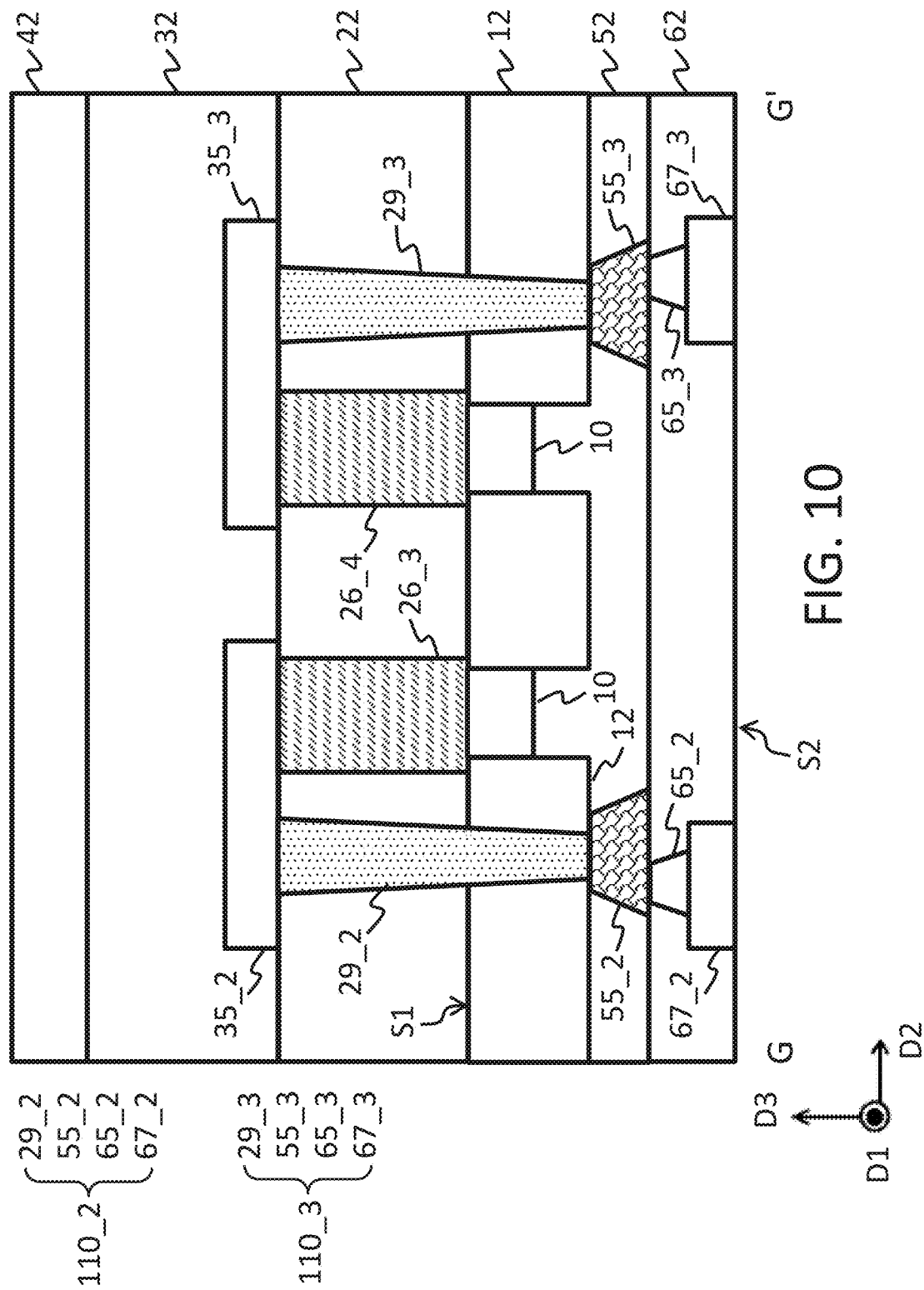

The second source/drain connection 35_2 may be electrically connected to a second contact structure 110_2 that may include a second contact plug 29_2, a second power rail 55_2, a second power via 65_2 and a second power wire 67_2. In some embodiments, the second source/drain connection 35_2 may contact the second contact plug 29_2 (e.g., an upper surface of the second contact plug 29_2) as illustrated in FIG. 10. The second contact structure 110_2 may extend through the first insulating layer 22 and the substrate structure 100. The second surface S2 of the substrate structure 100 may expose a portion of the second contact structure 110_2 (e.g., a portion of the second power wire 67_2). The exposed portion of the second contact structure 110_2 may be a second conductive pad that may be electrically connected to a second probe of the voltage meter. In some embodiments, the substrate structure 100 may not cover at least a portion of the second contact structure 110_2 (e.g., at least a portion of the second power wire 67_2) as illustrated in FIG. 10.

The third source/drain connection 35_3 may be electrically connected to a third contact structure 110_3 that may include a third contact plug 29_3, a third power rail 55_3, a third power via 65_3 and a third power wire 67_3. In some embodiments, the third source/drain connection 35_3 may contact the third contact plug 29_3 (e.g., an upper surface of the third contact plug 29_3) as illustrated in FIG. 10. The third contact structure 110_3 may extend through the first insulating layer 22 and the substrate structure 100. The second surface S2 of the substrate structure 100 may expose a portion of the third contact structure 110_3 (e.g., a portion of the third power wire 67_3). The exposed portion of the third contact structure 110_3 may be a third conductive pad that may be electrically connected to a current sensing circuit. In some embodiments, the substrate structure 100 may not cover at least a portion of the third contact structure 110_3 (e.g., at least a portion of the third power wire 67_3) as illustrated in FIG. 10.

Gate contacts 37 may be provided in the second insulating layer 32. The gate contacts 37 may be electrically connected to the first and second gate electrodes 24_1 and 24_2, respectively. In some embodiments, the gate contacts 37 may contact upper surfaces of the first and second gate electrodes 24_1 and 24_2, respectively. A gate wire 45 may be provided in the third insulating layer 42. In some embodiments, the gate wire 45 may contact upper surfaces of the gate contacts 37 and an upper surface of the second insulating layer 32. The gate wire 45 may overlap the gate contacts 37 and the first and second gate electrodes 24_1 and 24_2 in the vertical direction.

Figure 9:
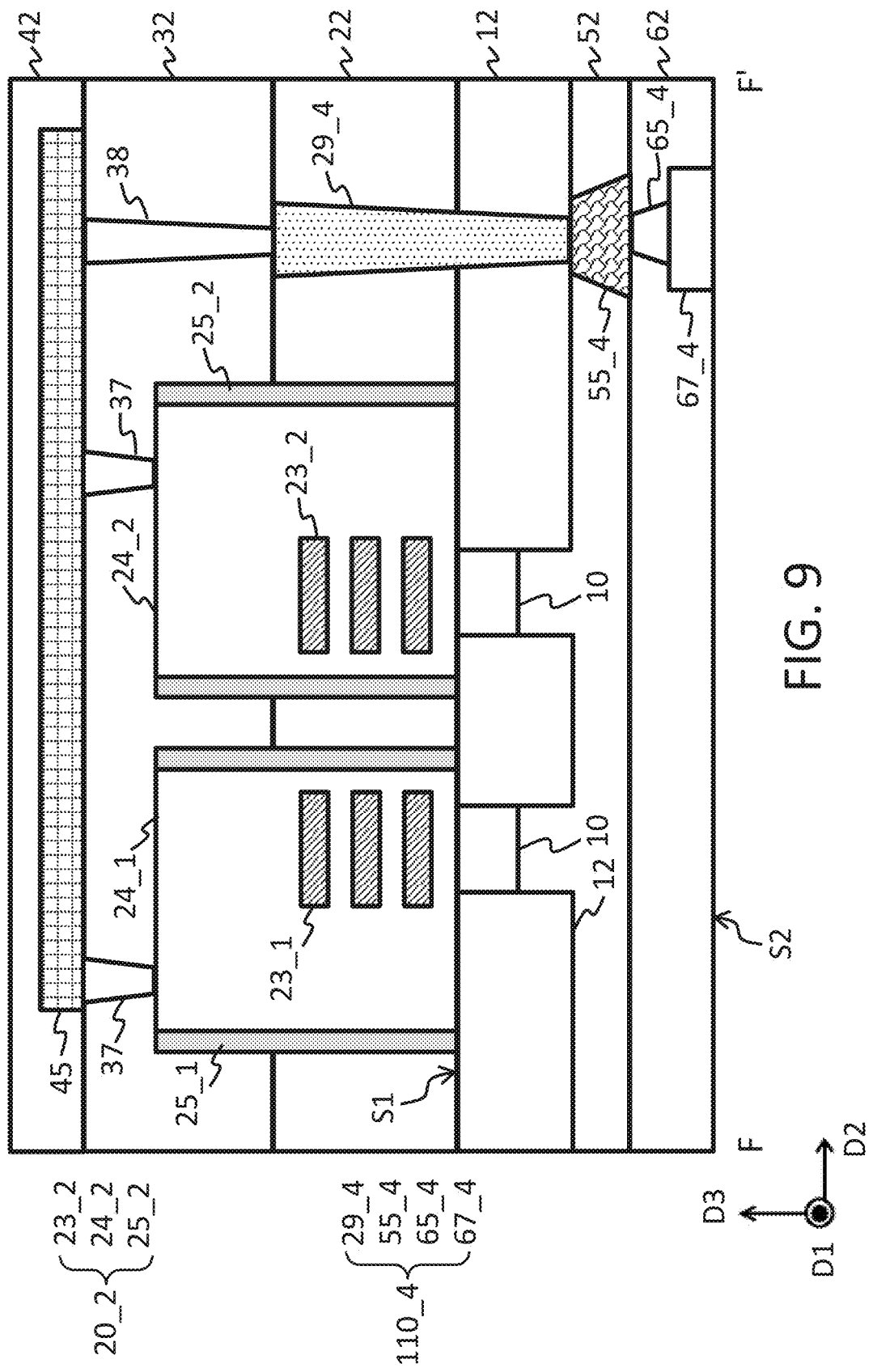

The gate wire 45 may be electrically connected to a fourth contact structure 110_4 that may include a fourth contact plug 29_4, a fourth power rail 55_4, a fourth power via 65_4 and a fourth power wire 67_4. The gate wire 45 may be electrically connected to the fourth contact structure 110_4 through a wire contact 38 provided in the second insulating layer 32. In some embodiments, the gate wire 45 may contact the wire contact 38 (e.g., an upper surface of the wire contact 38), and the wire contact 38 may contact the fourth contact plug 29_4 (e.g., an upper surface of the fourth contact plug 29_4) as illustrated in FIG. 9.

The fourth contact structure 110_4 may extend through the first insulating layer 22 and the substrate structure 100. The second surface S2 of the substrate structure 100 may expose a portion of the fourth contact structure 110_4 (e.g., a portion of the fourth power wire 67_4). The exposed portion of the fourth contact structure 110_4 may be a fourth conductive pad through which a gate voltage is applied. In some embodiments, the substrate structure 100 may not cover at least a portion of the fourth contact structure 110_4 (e.g., at least a portion of the fourth power wire 67_4) as illustrated in FIG. 9.

Figure 11:
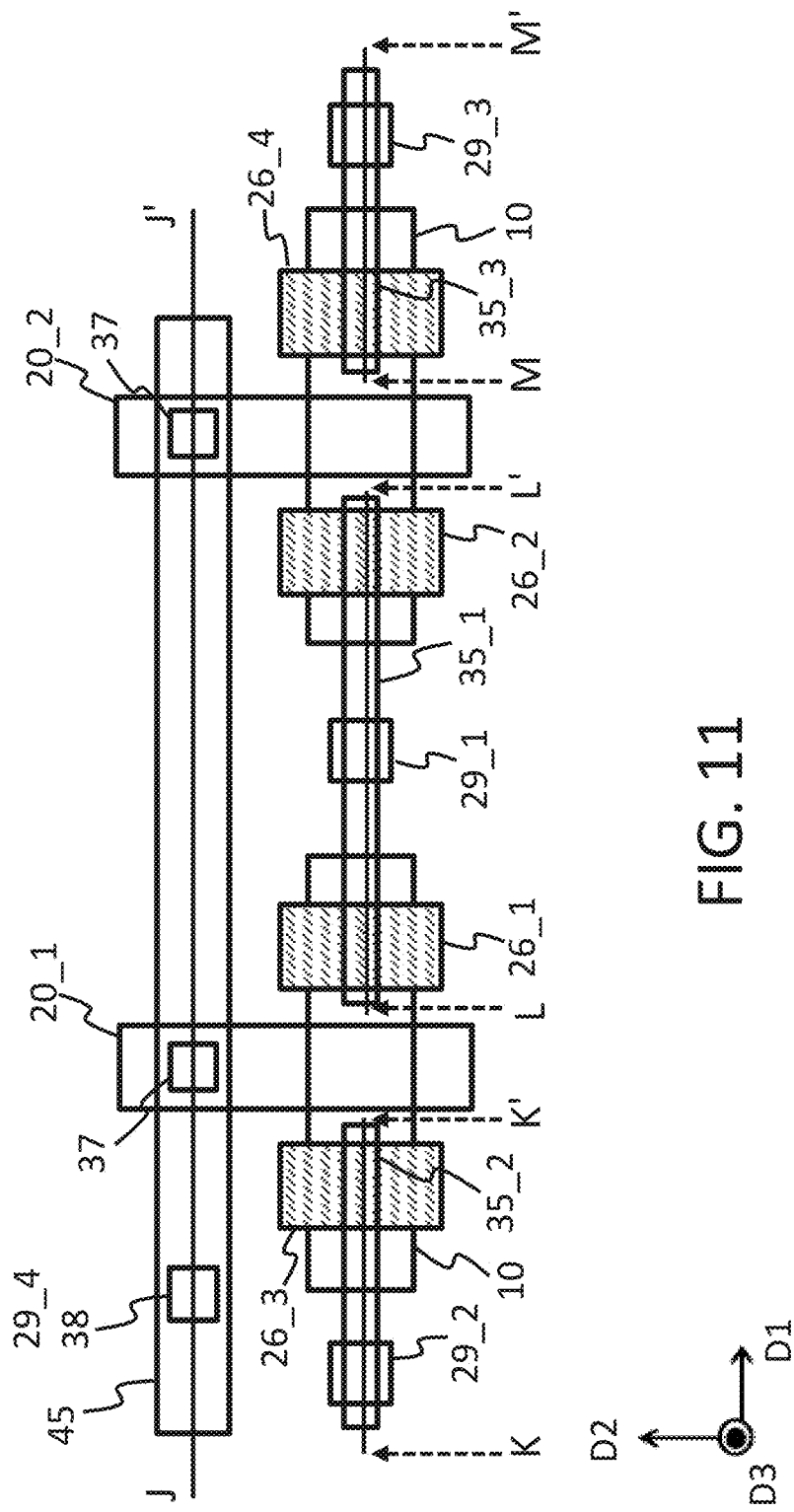
FIG. 11 is a layout of the resistance measuring structure in FIG. 5 according to some embodiments of the present invention.
Figure 12:
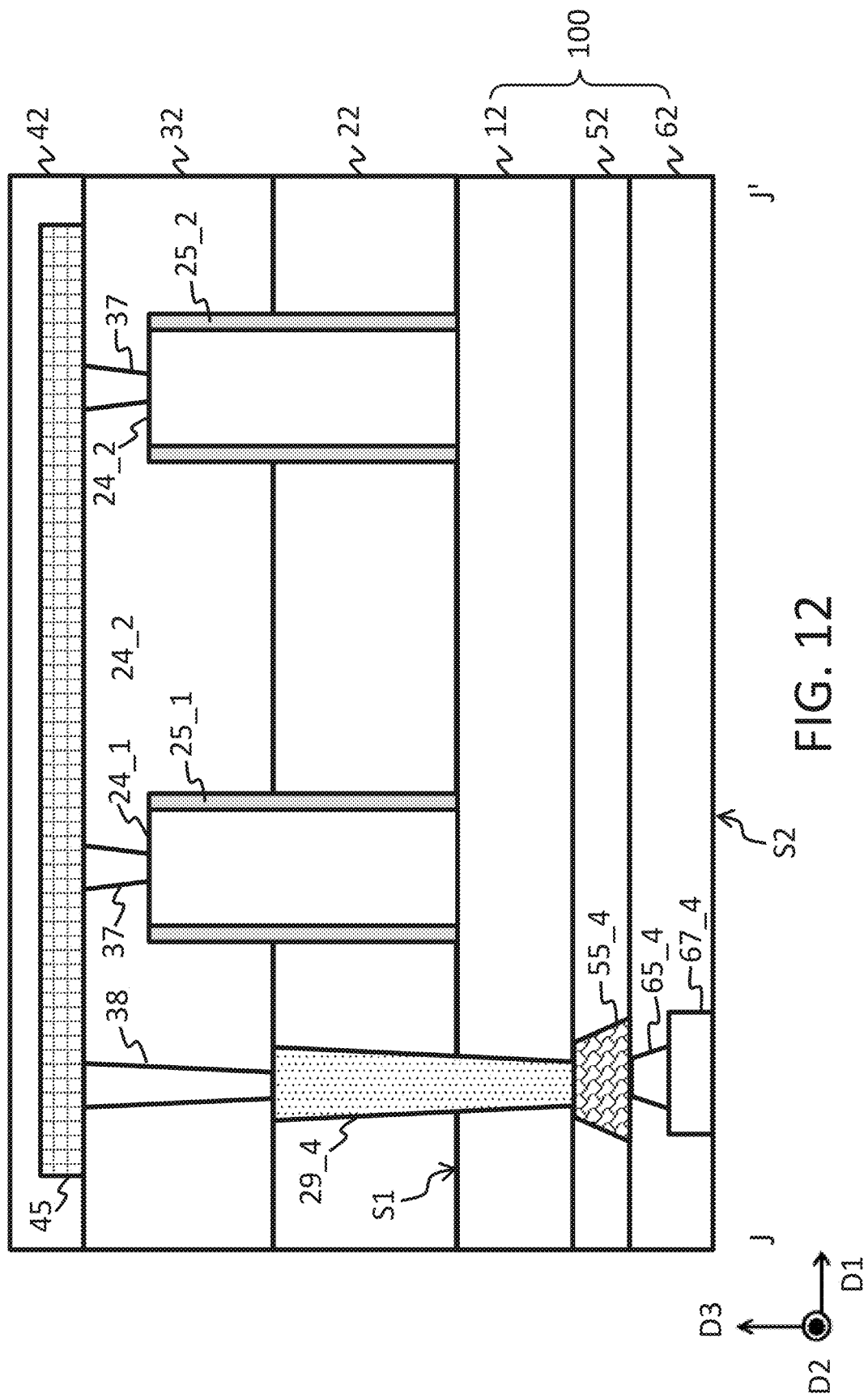
FIG. 12 illustrates a cross-sectional view taken along the line J-J' in FIG. 11.
Figure 13:
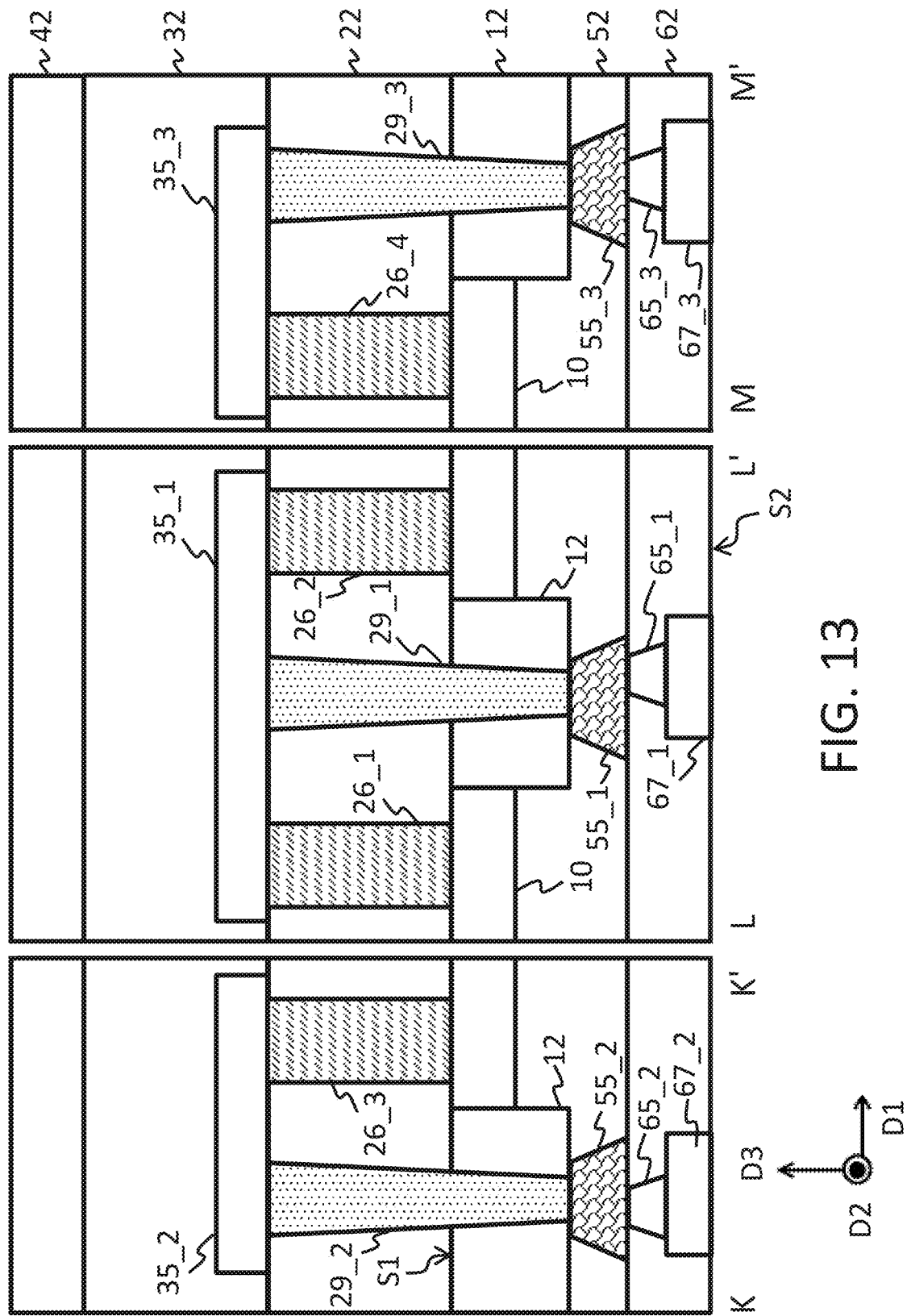
FIG. 13 illustrates cross-sectional views taken along the lines K-K', L-L' and M-M' in FIG. 11 according to some embodiments of the present invention.

FIG. 11 is a layout of the resistance measuring structure in FIG. 5 according to some embodiments, FIG. 12 illustrates a cross-sectional view taken along the line J-J' in FIG. 11, and FIG. 13 illustrates cross-sectional views taken along the lines K-K', L-L' and M-M' in FIG. 11 according to some embodiments. The resistance measuring structure illustrated in FIGS. 11 to 13 may be similar to the resistance measuring structure illustrated in FIGS. 6 to 10 with a primary difference that the first gate structure 20_1 and the second gate structure 20_2 are spaced apart from each other in the first direction D1 in FIG. 11.

An element of the first region of the integrated circuit device illustrated in FIGS. 2 to 4 and its corresponding element of the second region of the integrated circuit device illustrated in FIGS. 7 to 10 and FIGS. 12 and 13 may be formed by the same process and/or may include the same material. The cell channel region 23c may correspond to the first and second channel regions 23_1 and 23_2. Further, the cell gate electrode 24c, the cell gate spacer 25c, the cell gate contacts 36, the cell gate wires 44, the contact plug 28, the cell power rail 54, the power via 64 and the power wire 66 may correspond to the first and second gate electrodes 24_1 and 24_2, the first and second gate spacers 25_1 and 25_2, the gate contacts 37, the gate wire 45, the first to fourth contact plugs 29_1 to 29_4, the first to fourth power rails 55_1 to 55_4, the first to fourth power vias 65_1 to 65_4 and the first to fourth power wires 67_1 to 67_4, respectively.

Figure 14:
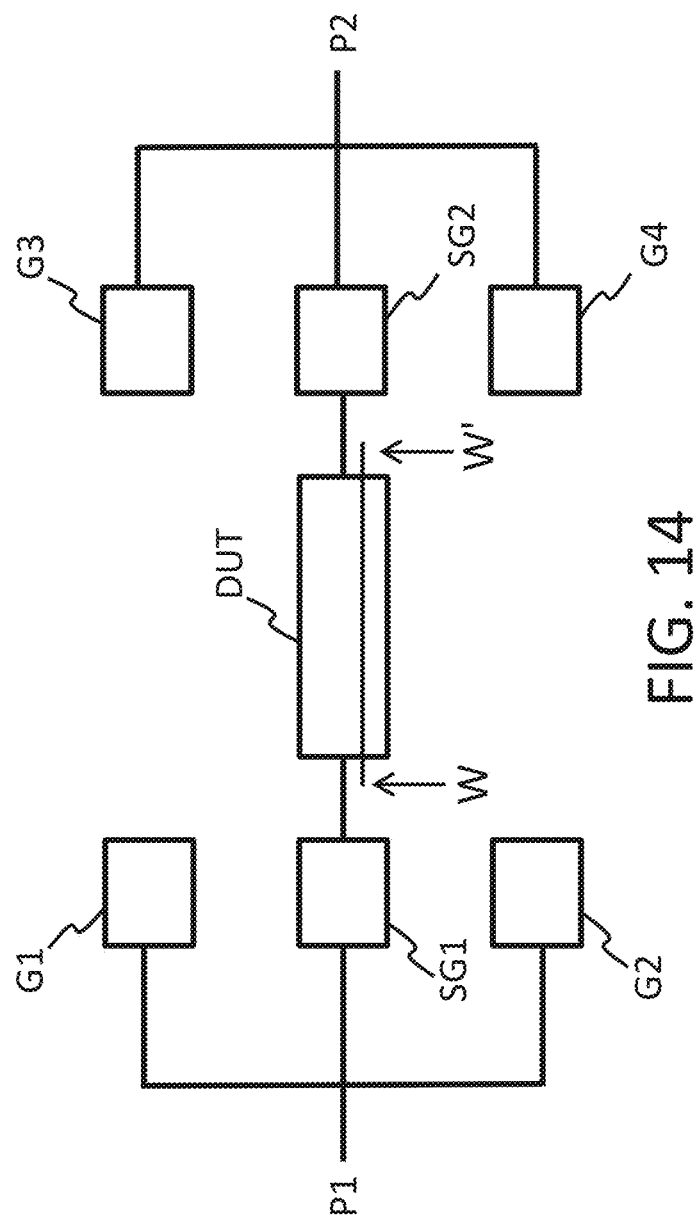
FIG. 14 illustrates the ground-signal-ground (GSG) configuration used for two-port s-parameter measurements for RF and microwave characterization of integrated circuit devices according to some embodiments of the present invention.

FIG. 14 illustrates the ground-signal-ground (GSG) configuration used for two-port s-parameter measurements for RF and microwave characterization of integrated circuit devices according to some embodiments. The ground-signal-ground (GSG) configuration may include six pads (i.e., first to fourth ground pads G1, G2, G3 and G4 and first and second signal pads SG1 and SG2) that are electrically connected to a device under test DUT. In some embodiments, the first signal pad SG1 may be provided between the first and second ground pads G1 and G2, and the first signal pad SG1 and the first and second ground pads G1 and G2 may be electrically connected to a first set P1 of RF probes. Similarly, in some embodiments, the second signal pad SG2 may be provided between the third and fourth ground pads G3 and G4, and the second signal pad SG2 and the third and fourth ground pads G3 and G4 may be electrically connected to a second set P2 of RF probes. The RF probes of the first and second sets may be, for example, coaxial connections or microprobes that may be based on a micro-coaxial cable with the centre conductor.

Procedures for extracting two-port s-parameter are described in various documents (e.g., Goldberg et al., "Accurate Experimental Characterization of Three-Ports," *IEEE MTT-S International Microwave Symposium Digest*, Boston, M A, 1991, pp. 241-244, and Goldberg et al., "Experimental electrical characterization of interconnects and discontinuities in high-speed digital systems," *IEEE Transactions on Components, Hybrids, and Manufacturing Technology*, vol. 14, no. 4, pp. 761-765, December 1991).

Figure 15:
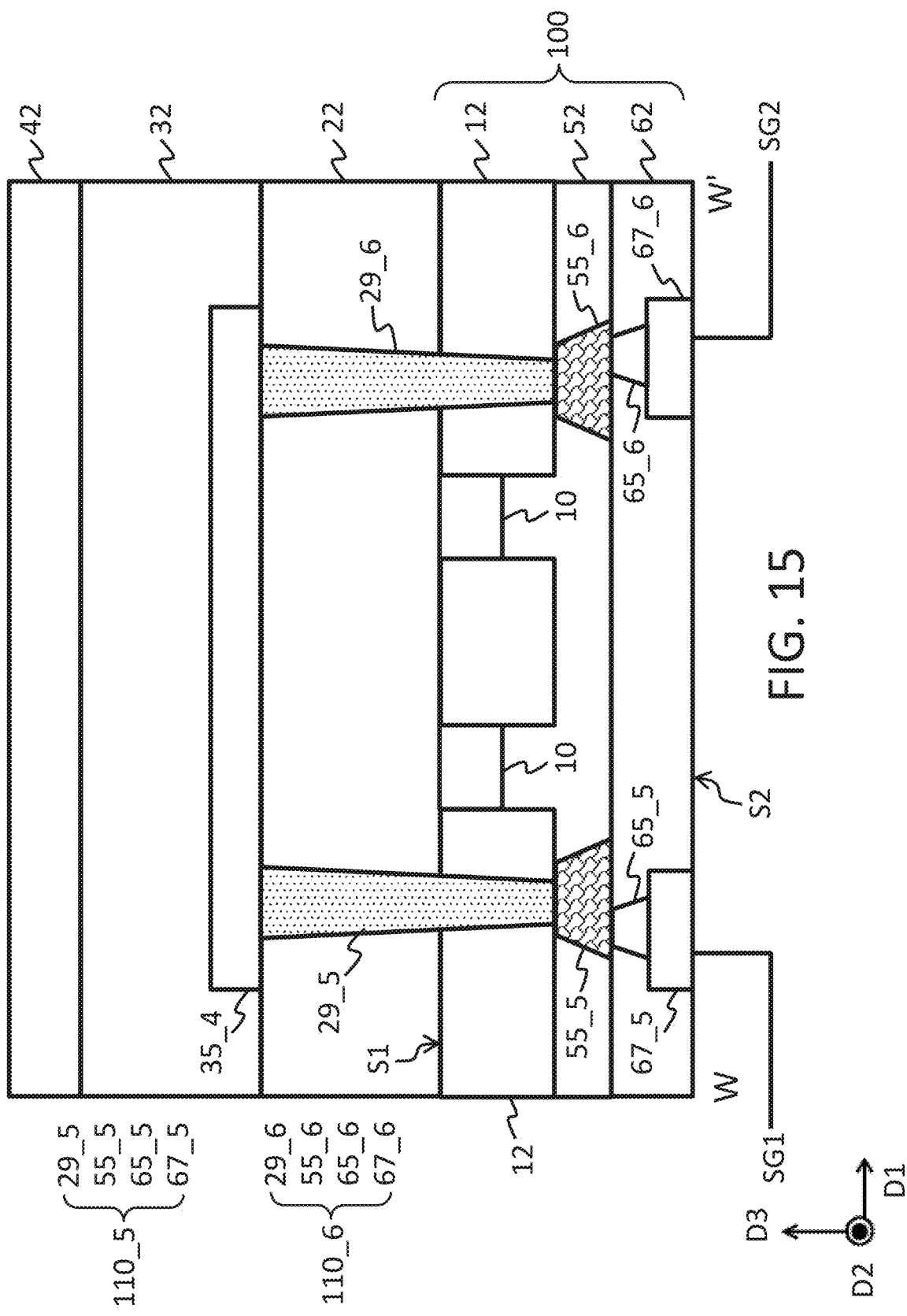
FIG. 15 illustrates a cross-sectional view of the device under test taken along the line W-W' in FIG. 14 according to some embodiments of the present invention.

FIG. 15 illustrates a cross-sectional view of the device under test DUT taken along the line W-W' in FIG. 14 according to some embodiments. The device under test DUT may include a fifth contact structure 110_5 electrically connected to the first signal pad SG1 and a sixth contact structure 110_6 electrically connected to the second signal pad SG2. The fifth contact structure 110_5 may include a fifth contact plug 29_5, a fifth power rail 55_5, a fifth power via 65_5 and a fifth power wire 67_5. In some embodiments, the fifth contact structure 110_5 may extend through the first insulating layer 22 and the substrate structure 100, and the second surface S2 of the substrate structure 100 may expose a portion of the fifth contact structure 110_5 (e.g., a portion of the fifth power wire 67_5) as illustrated in FIG. 15. The fifth contact plug 29_5 may extend through one of the isolation regions 12. In some embodiments, the exposed portion of the fifth contact structure 110_5 may contact the first signal pad SG1 or may be a portion of the first signal pad SG1. In some embodiments, the substrate structure 100 may not cover at least a portion of the fifth contact structure 110_5 (e.g., at least a portion of the fifth power wire 67_5) as illustrated in FIG. 15.

The sixth contact structure 110_6 may include a sixth contact plug 29_6, a sixth power rail 55_6, a sixth power via 65_6 and a sixth power wire 67_6. In some embodiments, the sixth contact structure 110_6 may extend through the first insulating layer 22 and the substrate structure 100, and the second surface S2 of the substrate structure 100 may expose a portion of the sixth contact structure 110_6 (e.g., a portion of the sixth power wire 67_6) as illustrated in FIG. 15. The sixth contact plug 29_6 may extend through one of the isolation regions 12. In some embodiments, the exposed portion of the sixth contact structure 110_6 may contact the second signal pad SG2 or may be a portion of the second signal pad SG2. In some embodiments, the substrate structure 100 may not cover at least a portion of the sixth contact structure 110_6 (e.g., at least a portion of the sixth power wire 67_6) as illustrated in FIG. 15.

The device under test DUT may also include a contact connection 35_4 that may be on and may be electrically connected to the fifth contact structure 110_5 and the sixth contact structure 110_6. In some embodiments, the contact connection 35_4 may overlap the fifth contact structure 110_5 and the sixth contact structure 110_6 in the vertical direction and may contact fifth contact structure 110_5 and the sixth contact structure 110_6 (e.g., upper surfaces of the fifth contact structure 110_5 and the sixth contact structure 110_6). In some embodiments, the contact connection 35_4 may contact the fifth contact plug 29_5 and the sixth contact plug 29_6 (e.g., upper surfaces of the fifth and sixth contact plugs 29_5 and 29_6). The contact connection 35_4 may also contact the first insulating layer 22 (e.g., the upper surface of the first insulating layer 22).

An element of the device under test DUT illustrated in FIG. 15 and its corresponding element of the first region of the integrated circuit device illustrated in FIGS. 2 to 4 may be formed by the same process and/or may include the same material. The contact connection 35_4, the fifth and sixth contact plugs 29_5 and 29_6, the fifth and sixth power rails 55_5 and 55_6, the fifth and sixth power vias 65_5 and 65_6, and the fifth and sixth power wires 67_5 and 67_6 may correspond to the source/drain contact 34, the contact plug 28, the cell power rail 54, the power via 64 and the power wire 66.

Example embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the ideas presented.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope is to be determined by the broadest permissible interpretation of the following claims and their equivalents and shall not be restricted or limited by the foregoing detailed description.

What is claimed is:

1. A resistance measuring structure comprising:
a first transistor and a second transistor on a substrate structure, wherein the first transistor comprises a first source/drain region and a first gate electrode, and the second transistor comprises a second source/drain region and a second gate electrode that is electrically connected to the first gate electrode;
a source/drain connection on the first and second source/drain regions, wherein the first source/drain region is electrically connected to the second source/drain region through the source/drain connection; and
a contact structure extending between the first and second source/drain regions and extending through the substrate structure.

2. The resistance measuring structure of claim 1, wherein the first transistor further comprises a third source/drain region, and the contact structure is a first contact structure, and
wherein the resistance measuring structure further comprises a second contact structure that extends through the substrate structure and is electrically connected to the third source/drain region.

3. The resistance measuring structure of claim 2, wherein the second transistor further comprises a fourth source/drain region, and
wherein the resistance measuring structure further comprises a third contact structure that extends through the substrate structure and is electrically connected to the fourth source/drain region.

4. The resistance measuring structure of claim 1, wherein the first and second source/drain regions are spaced apart from each other in a horizontal direction, and
the source/drain connection overlaps the first and second source/drain regions in a vertical direction.

5. The resistance measuring structure of claim 1, wherein the contact structure is a first contact structure, and the resistance measuring structure further comprises a fourth contact structure that extends through the substrate structure and is electrically connected to the first and second gate electrodes.

6. The resistance measuring structure of claim 5, wherein the first and second gate electrodes are spaced apart from each other in a horizontal direction, and
the resistance measuring structure further comprises a gate connection that overlaps the first and second gate electrodes in a vertical direction.

7. The resistance measuring structure of claim 1, wherein the substrate structure comprises:
an insulating layer; and
a semiconductor substrate that comprises an isolation region and extends between the first and second transistors and the insulating layer,
wherein the contact structure extends through the isolation region.

8. The resistance measuring structure of claim 1, wherein the contact structure is configured to be electrically connected to a first probe of a voltage meter, and
wherein the first transistor further comprises a third source/drain region that is configured to be electrically connected to a second probe of the voltage meter.

9. The resistance measuring structure of claim 8, wherein the contact structure is further configured to be electrically connected to a current source while measuring resistance.

10. A resistance measuring structure comprising:
a first transistor and a second transistor on a substrate structure, wherein the first transistor comprises a first source/drain region, and the second transistor comprises a second source/drain region that is electrically connected to the first source/drain region, and wherein the first transistor further comprises a third source/drain region; and
a first conductive pad and a second conductive pad in the substrate structure, wherein the first conductive pad is electrically connected to the first and second source/drain regions, and the second conductive pad is electrically connected to the third source/drain region,
wherein the substrate structure comprises a first surface facing the first and second source/drain regions and a second surface opposite the first surface, and
the second surface of the substrate structure exposes respective portions of the first and second conductive pads.

11. The resistance measuring structure of claim 10, wherein the first conductive pad is configured to be electrically connected to a first probe of a voltage meter, and the second conductive pad is configured to be electrically connected to a second probe of the voltage meter.

12. The resistance measuring structure of claim 10, wherein the first transistor further comprises a first gate electrode,
the resistance measuring structure further comprises a third conductive pad that is in the substrate structure and is electrically connected to the first gate electrode, and
the second surface of the substrate structure exposes a portion of the third conductive pad.

13. The resistance measuring structure of claim 12, wherein the second transistor further comprises a second gate electrode that is electrically connected to the first gate electrode.

14. The resistance measuring structure of claim 10, wherein the second transistor further comprises a fourth source/drain region,
the resistance measuring structure further comprises a fourth conductive pad that is in the substrate structure and is electrically connected to the fourth source/drain region, and
the second surface of the substrate structure exposes a portion of the fourth conductive pad.

15. The resistance measuring structure of claim 10, wherein the first conductive pad is a portion of a contact structure that extends through the substrate structure.

16. The resistance measuring structure of claim 15, wherein the contact structure extends between the first and second source/drain regions.

17. The resistance measuring structure of claim 15, further comprising a source/drain connection that is on and is electrically connected to the first and second source/drain regions,
wherein the source/drain connection comprises a surface facing the substrate structure, and the contact structure contacts the surface of the source/drain connection.

18. An integrated circuit device comprising:
a cell transistor that is on a substrate structure and comprises a cell gate electrode;
an insulating layer on the substrate structure, wherein the cell gate electrode is in the insulating layer; and
a parameter measuring structure comprising first and second contact structures that extend through the substrate structure and the insulating layer, wherein the substrate structure comprises a first surface facing the insulating layer and a second surface opposite the first surface, and the second surface of the substrate structure expose respective portions of the first and second contact structures.

19. The integrated circuit device of claim 18, wherein the first and second contact structures are spaced apart from each other in a horizontal direction, the integrated circuit device further comprises a metal wire that extends longitudinally in the horizontal direction and contacts the first and second contact structures, and the insulating layer is between the substrate structure and the metal wire.

20. The integrated circuit device of claim 18, wherein the insulating layer is a first insulating layer, and the substrate structure comprises a second insulating layer and a semiconductor substrate that comprises a plurality of isolation regions and extends between the second insulating layer and the cell gate electrode, and wherein the first contact structure extends through one of the plurality of isolation regions.

* * * * *